(12) United States Patent
Hellwig

(10) Patent No.: US 7,443,742 B2
(45) Date of Patent: Oct. 28, 2008

(54) MEMORY ARRANGEMENT AND METHOD FOR PROCESSING DATA

(75) Inventor: Franz Hellwig, München (DE)

(73) Assignee: Infineon Technologies AG, Munich (DE)

( * ) Notice: Subject to any disclaimer, the term of this patent is extended or adjusted under 35 U.S.C. 154(b) by 368 days.

(21) Appl. No.: 11/318,330

(22) Filed: Dec. 23, 2005

(65) Prior Publication Data

US 2006/0203603 A1 Sep. 14, 2006

(30) Foreign Application Priority Data

Dec. 23, 2004 (DE) .................... 10 2004 062 282.5

(51) Int. Cl.
*G11C 7/00* (2006.01)
(52) U.S. Cl. ................ 365/194; 365/191; 365/193; 365/189.08; 365/76; 327/147; 327/153; 711/167
(58) Field of Classification Search ............ 365/194, 365/193, 191, 189.08, 76; 327/147, 153; 711/167
See application file for complete search history.

(56) References Cited

U.S. PATENT DOCUMENTS

| | | | |
|---|---|---|---|
| 6,043,694 A | 3/2000 | Dortu | |
| 6,487,648 B1 | 11/2002 | Hassoun | |
| 6,714,471 B2 * | 3/2004 | Kono | 365/189.15 |
| 6,717,887 B1 * | 4/2004 | Kono et al. | 365/189.14 |
| 6,801,989 B2 * | 10/2004 | Johnson et al. | 711/167 |
| 6,914,828 B2 * | 7/2005 | Kono | 365/189.15 |
| 6,965,532 B2 * | 11/2005 | Shim | 365/194 |
| 2003/0151433 A1 | 8/2003 | Takai | |
| 2005/0018528 A1 | 1/2005 | Hellwig | |

FOREIGN PATENT DOCUMENTS

DE 103 335 22 2/2005

OTHER PUBLICATIONS

Despaux, Olivier. "QDR II SRAM Local C locking Interface for Virtex-II Pro Devices." *Xilinx*, XAPP750 (v. 1.0). Virtex-II Series. Xilinx, Inc. May 24, 2004. (14 Pages).
Despaux C., "QDR II SRAM Local Clocking Interface for Virtex-II Pro Devices," Xilinx Application Note XAPP750 (v. 1.0), May 24, 2004, pp. 1-13 (13 pages).

* cited by examiner

*Primary Examiner*—Viet Q Nguyen
(74) *Attorney, Agent, or Firm*—Maginot, Moore & Beck

(57) ABSTRACT

A memory arrangement for processing data comprises a memory, an interface operatively coupled to the memory, a DLL circuit and at least one register device comprising a data input and a clock input. Read data is applied to the interface in response to a read access to the memory. An RDT clock signal, which is derived from an internal clock signal and is in synchronism with the read data, is permanently applied to the interface. The DLL circuit provides a delayed clock signal defining a optimum sampling time for the read data as a signal obtained by comparing the internal clock signal with the RDT clock signal and shifting the obtained signal if at least one of a set-up time or a hold time is violated. The data input of said at least one register device is connected to the interface and the delayed clock signal is applied to the clock input of the at least one register device in order to sample the read data.

18 Claims, 2 Drawing Sheets

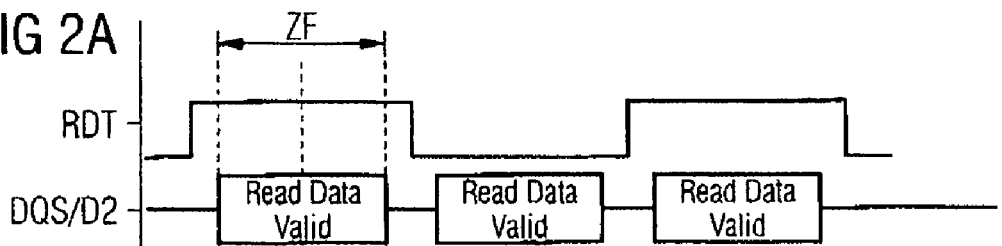
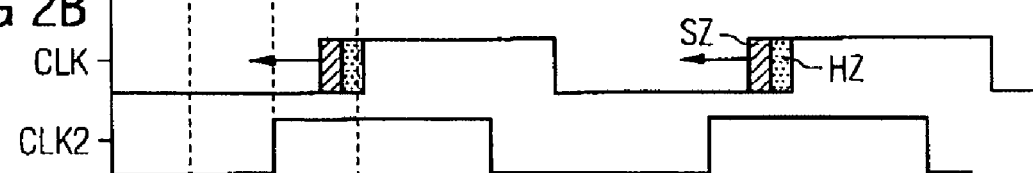
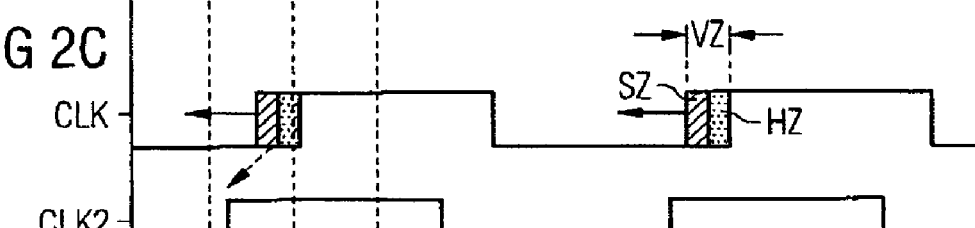
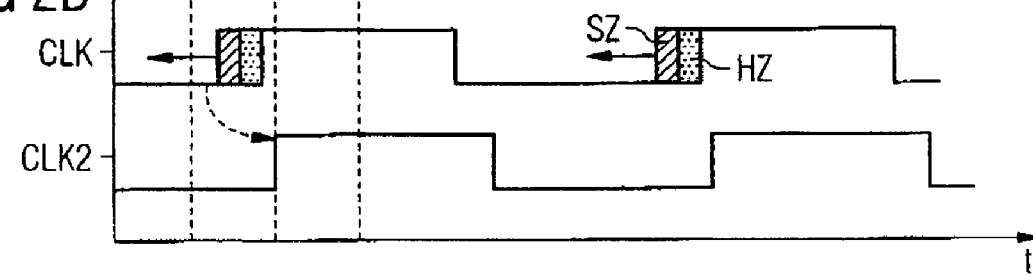

MEMORY ARRANGEMENT AND METHOD FOR PROCESSING DATA

BACKGROUND OF THE INVENTION

1. Field of the Invention

The invention relates to a memory arrangement for processing data. The invention also relates to a method for data processing.

2. Description of the Prior Art

A DLL circuit (DLL=Delay Locked Loop), which is frequently also referred to as a phase locked loop is generally used to maintain a defined delay between two correlated signals. One such DLL circuit is described, for example, in U.S. Pat. No. 6,043,694.

The ever more stringent requirements for reliability, smaller dimensions, reduced power consumption, higher processing speed and lower price for integrated circuits are leading to an ever greater scale of integration and to the development of large-scale and very-large-scale integrated circuits. In the course of this development work, complete systems are also increasingly being implemented on one chip, so-called SOC systems (SOC=System On Chip). SOC systems such as these are used for widely differing applications in order to keep the development effort within acceptable limits and so that the system can still be produced in sufficiently large quantities, and thus on a cost-optimized basis. For flexibility reasons, modern SOC architectures therefore have only those functional units on the chip which are required for the various applications. The other application-specific functional units can be externally coupled via an interface, as required.

For example modern SOC architectures use external memory modules where greater memory resources than are available in the respective SOC system are required for the particular application. These external memory modules are coupled to the SOC system via an external interface, and can be read from and written to via an interface controller, which is a component of the SOC system.

Memory modules such as these may, for example be in the form of DDR-SDRAM memories (DDR=Double Data Rate; SDRAM=Synchronous Dynamic Read Access Memory). In contrast to conventional SDR-SDRAM memories (SDR=Single Data Rate) the data in the case of DDR-memories is transmitted not only on the rising flanks but also on the falling flanks of the system clock. Data can thus be transmitted at a higher frequency by means of a DDR-SDRAM memory, which means that, with a bus clock of 100 MHz, a DDR-SDRAM memory operates effectively at 200 MHz, and the transmission rate rises to 1.6 GBit/s, in comparison to 0.8 Gbit/s for conventional SDR-SDRAM memories, for example. The actual memory cells in DDR-SDRAM memories operate no quicker than conventional SDR-SDRAM memories, but they are addressed in pairs and are then read successively, so that this effectively allows twice the data transmission rate. DDR memories thus transmit two data words in each clock cycle. This principle has been known for a very long time and is used in many processors, such that the design and method of operation of such memories will not be described in any more detail in the following text.

In order that the data transmission of the two data words which are read in each clock cycle takes place precisely in reality, DDR-SDRAM memories contain an internal clock synchronization circuit, which is typically in the form of a DLL circuit. This DLL circuit produces a defined signal delay for signals to and from externally coupled memories. In order to maintain the precise synchronicity of the data signals and the clock signals during a data transfer as well, a differential clock signal is used.

In the case of modern memory technologies, such as DDR-SDRAM memories, DQS signals or a DQS signal change are/is transmitted from the memory module together with the data that has been read. These DQS signals, which are also referred to as data strobe signals, are also transmitted at the same time as the data to be read and indicate that a valid data item has been applied to the bus interface, and can be read from them. These DQS signals are transmitted only when a valid data item is present. This DQS signal allows the data item to be read to be read on a clocked basis via the bus interface.

Owing to the asynchronous character of this data item to be read and of the associated DQS signals, the clocked data item which has been read must either be synchronized at the memory interface to the system clock of the SOC system, or else it is possible to use stable environmental parameters by the choice of low frequencies and over wide ranges to guarantee that the data item which has been read arrives at the bus interface synchronously and in the process, as far as possible, no infringement of the set-up time and hold time is registered with the system clock. The time periods for the hold time and for the set-up time define a so-called "forbidden zone" in which the sampling time for reading the read data must not be applied, since data losses could then occur when reading the data. In the former case, the bandwidth to the external memory module would have to be undesirably reduced by the additional synchronization steps required for this purpose. The second case results in a bandwidth reduction because of the lower maximum frequency at which the external memory module is operated. Both cases thus result in a lower maximum frequency and thus a lower data transmission rate. A further disadvantage is that a stable ambient temperature to which the SOC system and the memory coupled to it are subject cannot always be guaranteed for many applications.

A third possibility is to choose the sampling time of the data to be read such that this is always in synchronism with the system clock. In this case, a DLL circuit which is controlled via the DQS signal and the system clock can be used to obtain the optimum sampling time DQS signal, in which case it is also necessary to ensure that there is no set-up time or hold time infringement. Since the DLL circuit is now controlled by means of signal changes in the DQS signal by the memory module, it is, however, necessary to ensure that this DQS signal also changes regularly, so that the sampling time which is defined by the DQS signal is matched to changes in the environmental parameters (for example in the temperature or the voltage).

One problem in this context is, however, that this DQS signal is transmitted only when read data is also being transmitted. If, however, no data is transmitted over a lengthy time period, then no DQS signal is transmitted either, as would be required for synchronization of the DLL circuit. This can lead to the DLL circuit no longer being matched, for example, to changing environmental parameters and, overall, this leads to the optimum sampling time for a read access being shifted relative to the system clock, with the consequence that the sampling time is now located in the "forbidden time period". If a read access is now made to the external memory after a lengthy time and the current setting of the DLL circuit is no longer matched to the propagation time of the signals from the memory module to the interface controller, this can in some circumstances lead to data losses, and this should be avoided as far as possible.

This is particularly problematic for memory arrangements designed for applications in the motor vehicle field (automotive applications). While in the case of conventional applications, for example in the case of so-called consumer or industrial applications, the propagation times of a clock signal from the SOC system to the external memory and back are in general shorter than one clock cycle of the system clock, these propagation times are considerably longer in the case of automotive applications owing to the environmental parameters which occur there and which vary to a very much greater extent. In particular automotive applications must be designed for a relatively wide temperature range from −40° C. to 150° C. These wide temperature fluctuations can result in the propagation times from the SOC system to the memory and back being greater than one clock cycle of the system clock, so that the read path is operated asynchronously with respect to the clock path in this case. This makes synchronization of the DLL circuit much harder, since in this case it can never be assumed that a clock cycle of the DQS signal coming from the memory module will now be within or outside one clock cycle of the system clock.

Published German application for patent 103 33 522 A1 assigned to the same applicant solves the above problem by making a forced read access or a dummy read access after a predetermined time. This allows the DLL circuit to be reset to the optimum sampling time. However, this results in additional circuitry complexity. Furthermore, this is not always feasible for some applications, such as the automotive applications described above.

SUMMARY OF THE INVENTION

It is an object of the present invention to specify a memory arrangement and a method for processing data, in which reliable data transmission is always ensured, even in the case of unstable environmental parameters, in particular with regard to the temperature.

The object is achieved in accordance with the invention by means of a memory arrangement for processing of data, having an interface which is coupled to a memory, to which interface read data is applied when a read access to the memory occurs and to which an RDT clock signal is permanently applied, which RDT clock signal is derived from an internal clock signal and is in synchronism with the read data, having a DLL circuit for determination of the optimum sampling time for the read data, which DLL circuit produces a delayed clock signal at a clock output by comparison of the internal clock signal with the RDT clock signal and by shifting of the clock signal which is obtained by comparison in the event of an infringement of the set-up time and/or of the hold time, which delayed clock signal defines a sampling time for the read data, which is applied to the interface, in synchronism with the internal clock signal, having at least one register device whose data input side is connected to the interface and to whose clock input side the delayed clock signal can be supplied in order to sample the read data which is applied to the interface.

The object is also achieved in accordance with the invention by means of a method for reading data from a memory, in particular in the case of a memory arrangement according to the invention, in which read data is applied to the memory at an interface when a read access to the memory occurs, in which an RDT clock signal which is derived from an internal clock signal and is in synchronism with the read data is permanently applied to the interface, in which a DLL circuit is provided in order to determine the optimum sampling time for the read data, in which the DLL circuit determines an optimum sampling time for the read data by comparison of the internal clock signal with the RDT clock signal, and produces a delayed clock signal, which is used for off-keying of the read data, as a function of the determined sampling time.

The idea on which the present invention is based is to use a modified DLL circuit with extended functionality to choose the sampling time for read data such that it is always in synchronism with the system clock, that is to say the internally produced clock signal, so that there is no longer any need to synchronize the read data that has been read to the system clock. In order to synchronize the DLL circuit, this DLL circuit is not supplied for this purpose with the DQS signal but with a so-called RDT signal (Read Data Clock Signal) which is derived directly from the internal clock signal. This RDT signal is supplied permanently to the SOC system, that is to say even when no read access is required, and no read data has thus been applied to the memory interface.

The RDT signal is made available to the SOC system directly from the memory module, or is derived from an internal or external clock signal via a feedback loop. The RDT signal, or its clock, is always in synchronism with the read data, and is also transmitted together with the read data. The RDT signal preferably corresponds to the characteristics of the internal clock signal, although there is a propagation time difference between this and the internal clock signal. In this case, the RDT signal is thus an internal clock signal that has been delayed by this propagation time difference. This propagation time difference takes account of the propagation time which is required by the clock signal to travel from the memory interface to the external memory module and back. Since the RDT signal is transmitted together with the read data that has been read, the RDT signal already inherently contains information about those environmental parameters (for example the ambient temperature) which delay the RDT signal, and thus the read data that has been read, by a greater or lesser extent with respect to the internal clock signal. The RDT signal and the read data which has been read are thus in synchronism with one another.

In the modified DLL circuit according to the invention and with extended functionality, this RDT signal which is produced by the memory module or the feedback loop is now compared with the system clock and is shifted such that the positive flank of the shifted RDT signal on the one hand occurs within the time window in which the read data is valid, but on the other hand is far enough away from the positive clock flank of the system clock to ensure that no set-up or hold time infringements occur in the event of off-keying by the shifted RDT signal and during direct further processing of the data on the basis of the system clock. The system clock can also additionally or alternatively be used as the basis for the sampling clock. One significant constraint for this is just that the length, that is to say the duration of the time window which is blocked on the basis of the set-up and hold time, is shorter than the time window for valid read data which is being applied to the memory interface. However, this is true in most cases.

The invention will be explained in more detail in the following text with reference to the exemplary embodiments which are illustrated in the figures of the drawing, in which:

DESCRIPTION OF THE PREFERRED EMBODIMENTS

Figure 1:
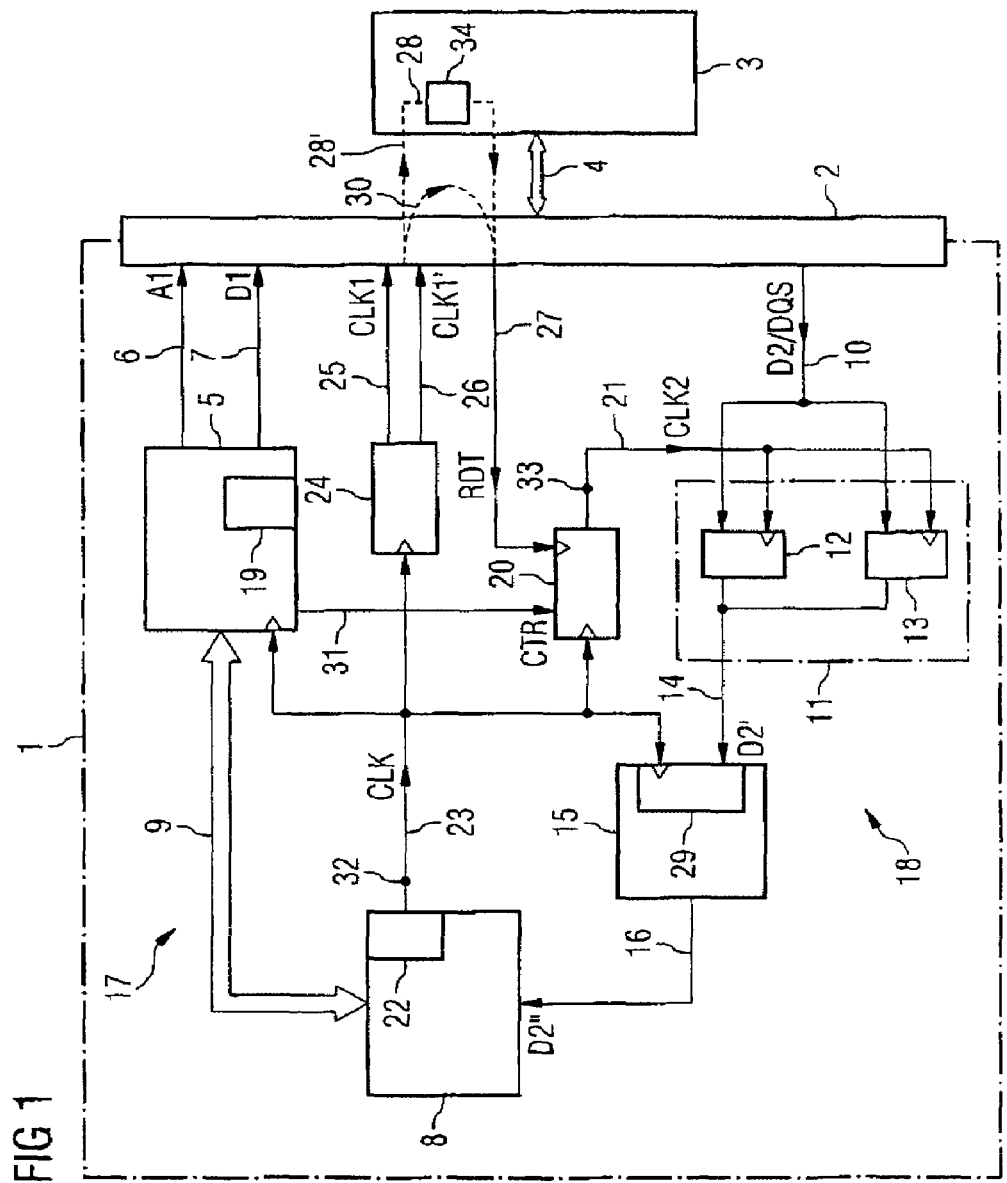
FIG. 1 is a block diagram of an inventive memory arrangement for processing data, and FIG. 2 are signal/timing diagrams for the system clock and for the RDT clock signal in order to illustrate the method of operation of the memory arrangement of FIG. 1.

Identical and functionally identical elements and signals have been provided with the same reference symbols in all of the figures in the drawing, unless stated to the contrary.

FIG. 1 shows a block diagram of a memory arrangement according to the invention for data processing, having an interface to an external memory module and a variable DLL circuit. The circuit arrangement according to the invention has an SOC system, which is annotated with the reference symbol 1. The SOC system 1 is connected to a memory module 3 via an external interface 2, and it is assumed that the memory module 3 in FIG. 1 is in the form of a DDR-SDRAM memory module—referred to for short in the following text as a DDR memory. The DDR memory 3 is coupled to the memory interface 2 via a bus 4. In the present exemplary embodiment, the bus 4 contains a large number of address and data lines, which can preferably be operated bidirectionally, as well as clock lines for bidirectional transmission of clock signals. The memory interface 2, in a corresponding manner, contains a large number of input/output connections (I/O ports) for injection of and tapping-off corresponding data, address and clock signals.

Data can thus be read from the DDR memory 3 and data can be written to appropriately addressed areas of the DDR memory 3 in response to an appropriate request from the SOC system 1, via the memory interface 2 and the bus 4. This data communication between the SOC system 1 and the DDR memory 3 is controlled via an interface controller 5, which is contained in the SOC system 1. The interface controller 5 is connected to the memory interface 2 via data/address lines 6, 7, via which data D1 and/or addresses A1 can be applied unidirectionally from the interface controller 5 to the memory interface 2. Data D1 can thus be written to the DDR memory 3 via the data lines 7, while, in contrast, corresponding memory areas in the DDR memory 2 can be addressed via the address lines 6.

The corresponding data items D1 which are intended to be written to the DDR memory 3 (write data) is produced in FIG. 1 by a computation device 8. The computation device 8 is coupled to the interface controller 5 via data and control lines 9 which can be operated bidirectionally. These data and control lines 9 are used on the one hand for data communication between the computation device 8 and the interface controller 5, and on the other hand for control purposes. In this case, the computation device 8 can also control the interface controller 5. Additionally or alternatively, the interface controller 5 can also control the computation device 8. For example, the computation device 8 may contain a programmable device, for example a microprocessor or a microcontroller.

Data D2 can also be read from the DDR memory 3 in response to appropriate requests from the SOC system 1 or from the interface controller 5. This data is then first of all applied to the memory interface 2 via the bus 4. The memory module 3 also transmits a DQS signal DQS with this data D2. This DQS signal DQS is in this case used as a so-called "Data Valid" signal, thus indicating whether valid read data D2 has been applied to the memory interface 2 for a read access.

The data D2 (read data) which has been read is first of all supplied via data lines 10, which can be operated unidirectionally, to a register device 11 in order to sample this data D2. In the case of a DDR memory architecture, the register device 11 contains two data sampling registers 12, 13 whose data inputs are connected to the data lines 10. Data D2 to be read is stored alternately in each case one of the data sampling registers 12, 13, with the control process being carried out by means of the clock of a delayed clock signal, CLK2. The delayed clock signal CLK2 is produced in a DLL circuit 20 which is provided specifically for this purpose, as will be described in the following text below. In this case the clock signal CLK2 is injected into the clock input of the data sampling register 12, and the inverted clock signal CLK2 is injected into the clock input of the data sampling register 13. The data D2 which has been read is sampled in the data sampling registers 12, 13, with the data D2 which is sampled at twice the frequency having half the data length, for example of 32 bits.

The data D2' that has been sampled in this way is supplied on the output side via data lines 14 to a device 15 for data preprocessing. In addition, the internal clock signal CLK which is used for off-keying of the data signals D2' in the device 15 is supplied to a clock input of this device 15. This device 15 may, for example, be in the form of a memory controller, a FIFO memory (FIFO=First In First Out), a buffer store a data bus, a cache memory, etc. The data in the device 15 in this case once again has twice the number of bits, for example 64 bits, since the data D2' which is produced on the output side from the two data sampling registers 12, 13 is at the same time injected into the device 15. In comparison to the data sampling registers 12, 13, the data is in this case processed at the normal frequency, that is to say at the frequency itself however. The data D2" which has been preprocessed in this way by the device 15 is supplied via data lines 16 to the computation device 8, which further-processes the data D2" that has been read in a suitable form, in accordance with a respective program.

The SOC system in FIG. 1 thus has a write path 17 and a read path 18. Data D1 can be written via the write path 17 and via the interface controller 5 from the computation device 8 to the DDR memory 3. In the case of the read path 18, data D2 is read from the DDR memory 3 via the interface 2, and is written via the register device 11 and the device 15 to the computation device 8. A respective DLL circuit 19, 20 is provided not only for the write path 17 but also for the read path 18. In the case of the write path 17, the DLL circuit 19 is a component of the interface controller 5. The DLL circuit 20 on the read path side produces a delayed clock signal CLK2, which is injected via clock lines 21 into the clock inputs of the data sampling registers 12, 13. The DLL circuits 19, 20 have a delay element (not illustrated in FIG. 1) especially for this purpose, which produces a suitable delay for the injected clock CLK. This delay element may, for example, comprise a row of diodes which produce a defined time delay.

The SOC system 1 furthermore has a device 22 for production of the internal clock signal CLK, which represents the system clock for the SOC system 1 and with which the external memory 3 can also be operated. This clock production device 22 in the present exemplary embodiment is a component of the computation device 8, but may also be in the form of a separate device in the SOC system 1, or an external clock production facility. The clock signal CLK which is produced by the clock production device 22 at its clock output is injected via clock lines 23 into respective clock inputs of the DLL circuits 19, 20 and of the device 15. The internal clock CLK is also supplied via the interface 2 to the DDR memory 3. For this purpose, the clock signal CLK is first of all supplied to a device 24, which uses the clock signal CLK to produce differential clock signals CLK1, CLK1' on the output side. The differential clock signal CLK1, CLK1' which is more resistant to interference than a non-differential, ground-related clock signal and can advantageously be evaluated with greater precision, is used in this case to improve the unison of the clock and data signals. The differential clock signals CLK1, CLK1' are supplied to the interface 2 via clock lines 25, 26.

Additionally or alternatively, it is possible to provide for the clock signal CLK to also be delayed in the device 24.

The clock signal CLK which is injected on the input side is delayed in a suitable form in the DLL circuit 20. The DLL circuit 20 is for this purpose controlled via a so-called RDT signal RDT (Read Data Clock Signal). This RDT signal RDT is supplied to the DLL circuit 20 via a control line 27. This RDT signal RDT is a clock signal RDT which is derived from the internal clock signal CLK or from the differential clock signals CLK1, CLK1'. In contrast to the DQS signal, which is transmitted only when valid data is present at the memory interface 2, the RDT signal RDT is present all the time, and is thus permanently available to the SOC system 1 from the memory module 3 via the memory interface 2. In a first refinement, this RDT signal RDT is produced by transmitting a clock signal from the memory 3 together with the data D2 which has been read from the memory 3 via clock lines 28 and via the interface 2 back to the SOC system 1. The clock signal may, for example, have been produced by the memory 3 itself, or may be produced by an external clock production device. The clock signal is typically obtained from the system clock CLK, CLK1, CLK1'. For this purpose, the clock signal CLK1, CLK1' is supplied via the interface 2 and the bus 4 to the memory (see the dashed line 28'). The clock signal which has been injected into the memory 3 in this way can then be delayed in the memory, for example, in a suitable manner via a PLL circuit 34, and can then be transmitted together with the data D2 which has been read from the memory module 3 via the clock lines 28 back to the SOC system 1.

Alternatively, a feedback loop 30 can also be provided for production of the RDT signal RDT, which feedback loop 30 models the propagation time which the clock signal CLK1, CLK1' would require to travel to the memory module 3 and back. The clock lines 28, 28', the PLL circuit 34 and the feedback loop 30 are only indicated in FIG. 1.

The clock of this RDT signal RDT is used to calibrate the DLL circuit 20 to the clock of the RDT signal RDT. The DLL circuit 20 thus produces at its clock output 33 a delayed clock signal CLK2 which is derived not only from the internal clock signal CLK but also from the RDT signal RDT and which is supplied—as has already been described above—to the clock inputs of the data sampling registers 12, 13. A fixed, optimum sampling time is set in the data sampling registers 12, 13 as a function of the delayed clock signal CLK2, and, in particular, is independent of fluctuations in the environmental parameters, in particular in the ambient temperature, since these parameters have already been taken into account in the RDT signal RDT which is used for production of the delayed clock signal CLK2.

The design and method of operation of a DLL circuit 20, as is used in the SOC system shown in FIG. 1, are in general widely known, so that they will not be described in any more detail here. With regard to the design of a DLL circuit for use in DDR-SDRAM memory modules a pair of data sampling registers is provided for reading data from the DDR memory, reference should be made to the US Patent Specification U.S. Pat. No. 6,043,694, which was mentioned in the introduction and which describes a latching circuit which is used for calibrated DLL circuits in DDR-SDRAM memory modules. With regard to the general design and the method of operation of a DLL circuit such as this and of the pairs of sampling registers that are used, as are illustrated for example in FIG. 1 of the present invention, the entire contents of this document U.S. Pat. No. 6,043,694 are hereby included in the present patent application.

The method according to the invention and the arrangement according to the invention for synchronizing of the DLL circuit 20 when reading read data from the DDR memory 3 will be explained in more detail in the following text with reference to the block diagram in FIG. 1 and the signal/timing diagrams in FIG. 2.

The memory module 3 transmits valid read data D2 together with a change in the DQS signal DQS to the memory interface 2. In addition, the memory interface 2 receives an RDT signal RDT, which is in synchronism with the DQS signal DQS and with the read data D2 which is applied to the memory interface 2 and which—as described above—is supplied to the memory interface 2 either directly from the memory module 3 (via the clock lines 28), by the memory module 3 from the internal clock CLK1, CLK1' (via the clock lines 28, 28' and, possibly, a PLL circuit 34) or via a feedback loop 30. The read data D2 which is transmitted from the memory module 3 is valid for a defined time period after a change in the DQS signal on the data bus 4 or the memory interface 2 (see FIG. 2A).

The DLL circuit 20 is used to determine the optimum sampling time for clocking and thus for reading the read data D2. The DLL circuit 20 uses the clock of the RDT signal RDT which is injected via the memory interface 2 as well as the internal clock signal CLK to generate a sampling time for sampling of the read data items D2, which are applied to the memory interface 2 at the same time.

The sampling time for sampling of the read data should on the one hand be in synchronism with the system clock CLK and on the other hand should be within a defined permissible time period in which the read data D2 is stable. This defined time period must be chosen such that it occurs in a defined manner outside a so-called "forbidden" time period V2 in which the set-up time SZ and the hold time HZ are located. In this context, synchronism means that the sampling time occurs before the next clock flank of the internal clock signal CLK, taking into account the set-up time ST, or, if this is not possible, occurs after the next clock flank of the internal clock signal CLK, taking into account the hold time HZ.

In one alternative variant, it would also be possible to shift the RDT signal RDT through, for example, ¼ of a clock period in a first step and thus to place the clock flanks in the center of the time window ZF for the read data D2 (see FIG. 2B). The shift through ¼ of a clock period can be provided in the DLL circuit 20 by measurement of the clock period of the internal clock signal CLK or of the RDT clock signal RDT and by means of appropriate scalable chains of delay elements.

In a further method step, the clock which has been shifted in this way of the RDT clock signal RDT is shifted once again by the DLL circuit 20 such that it is outside the forbidden time window VZ by the positive clock flank of the system clock CLK. In the end, this results in a shifted clock signal CLK2 of which the read data D2 can be off-keyed within its area of validity, that is to say outside the forbidden time period VZ which is predetermined by the set-up and hold time SZ, HZ, and is at the same time in synchronism with the system clock CLK.

If the clocks of the RDT clock signal RDT and of the system clock CLK are now shifted relative to one another, for example as a result of changing temperature conditions, which are evident in particular by a change in the propagation times of the RDT clock signal RDT, then the clock CLK2 which is used for sampling of the read data D2 is also shifted appropriately if it collides with the forbidden time window VZ by the system clock CLK (FIG. 2C).

This procedure can be continued indefinitely, although only until the delayed clock CLK2 for sampling of the read data D2 falls out of the time window ZF for the valid read data D2. In this case, the delayed clock signal CLK2 for sampling of the read data D2 is shifted from the modified DLL circuit 20 to the other side of the forbidden time window VZ in each case (see FIG. 2D). Admittedly, this results in the loss of one clock cycle for the reading of the read data D2. However, this prevents any loss of data occurring. At the same time, it does not result in any infringements of the set-up and hold times SZ, HZ. This mechanism for production and matching of the delayed clock signal CLK2, that is to say first of all the shifting of this clock signal CLK2 and, before leaving the time window ZF for the read data D2, jumping to the other side of the time window ZF works in both directions, of course.

The variation or the jumping of the delayed clock signal CLK2 ideally and preferably takes place between two read accesses. This typically does not represent a problem since, in comparison to the duration of a read access, the shifting of the system clock CLK and RDT clock RDT relative to one another takes place relatively slowly. The jumping of the delayed clock signal CLK2 between two read accesses may, for example, be implemented in such a way that the interface controller 5 uses a control signal CTR to signal to the DLL circuit 20 that a read access should be made, and the time at which this read access should be made. Other implementations and solutions would, of course, also be feasible in this case.

Since the data D1, D2 can be transmitted bidirectionally between the SOC system 1 and the memory module 3, the inputs of the memory interface 2 for the read data D2 and the DQS signals DQS must be set to a fixed value for as long as they are not being sent via the memory module 3. The data sampling registers 12, 13 may, for example, be fed back via a multiplexer (not illustrated in FIG. 1) or may be controlled by the interface controller 5 in order to record new read data D2 during a read access. This multiplexer can be controlled by the interface controller 5 since, although this is operated asynchronously with respect to the RDT signal RDT, the maximum time shift with respect to the internal clock CLK can, however, be estimated relatively accurately. The read data D2 and the DQS signals DQS from the memory module 3 may, of course, also be masked directly, for example via the interface controller 5, provided that no read accesses are made.

The read data D2 is sampled in the data sampling registers 12, 13 by means of the delayed clock signal CLK2. In addition, the DQS signal DQS could also be used for this purpose for a read access, signaling to the data sampling registers 12, 13 when valid read data D2 has been applied to the memory interface 2, and when this data is ready to be read to the data sampling registers 12, 13.

The read data D2' is then produced at the output of the data sampling registers 12, 13 in synchronism with the system clock CLK, and can thus also be processed further in the time domain of the system clock CLK. For this purpose, this read data D2 (together with the DQS signals DQS) may, for example, be off-keyed once again in the device 15 for data preprocessing, using the system clock CLK. For this purpose, the device 15 may be equipped with a further data sampling register 29. Alternatively, the synchronous read data D2' can now also be processed further directly, and may be off-keyed by the system clock CLK only after this has been done.

Although the present invention has been described above with reference to one preferred exemplary embodiment, it is not restricted to this but can be modified in many ways.

Thus, in particular, the invention is not restricted to an SOC system, but can also be extended to any desired systems which are coupled to an external memory module via a memory interface and which have a DLL circuit. In addition, only one architecture example has been described for the SOC system, and this can be amended very easily by appropriate change and modification without, however, departing from the basic idea of the present invention. Furthermore, the invention is not restricted to the use of one specific DDR-SDRAM memory, but can also be extended to any desired memory modules which, in particular, may have a similar functionality.

It is self-evident that the cited numerical examples have been quoted only by way of example, and the invention is not intended to be restricted to them.

The corresponding controllers are, in the present case, in the form of programmable devices, in particular microcontrollers or microprocessors. However, the function of these elements can additionally or alternatively also be replaced by any other programmable device or else by means of a hard-wired device which is designed to execute an appropriate program, or by a programmable circuit, for example an FPGA or PLD circuit.

The present exemplary embodiment has in each case referred to DQS signals and RDT signals. It is self-evident that these expressions can also be understood as meaning, in particular a signal change in these signals, that is to say a rising flank and/or a falling flank of the DQS signal or of the RDT signal. A plurality of DQS signals and/or a plurality of RDT signals, for example four, may also be provided instead of a single DQS signal or RDT signal.

Although modifications and changes may be suggested by those skilled in the art, it is the intention of the inventor to embody within the patent warranted heron all changes and modifications as reasonably and properly come within the scope of his contribution to the art.

I claim as my invention:

1. A memory arrangement for processing data, comprising:
   a memory;
   an interface, to which read data is applied in response to a read access to said memory and to which an RDT clock signal being derived from an internal clock signal and being in synchronism with said read data is permanently applied; said interface being operatively coupled to said memory;
   a DLL circuit for determining an optimum sampling time for said read data; said DLL circuit providing, at a clock output, a delayed clock signal defining said optimum sampling time for said read data being applied to said interface and being in synchronism with said internal clock signal; said DLL circuit providing said delayed clock signal as a signal obtained by comparing said internal clock signal with said RDT clock signal and shifting said obtained signal if at least one of a set-up time or a hold time is violated; and
   at least one register device comprising a data input and a clock input; said data input being connected to said interface and said delayed clock signal being applied to said clock input in order to sample said read data being applied to said interface.

2. The memory arrangement of claim 1, wherein said DLL circuit comprises a first input for inputting said internal clock signal and a second input for inputting said RDT clock signal.

3. The memory arrangement of claim 1, comprising a feedback device for producing said RDT clock signal; said feedback device modeling a propagation time which said internal clock signal requires to propagate from said interface to said memory and back.

4. The memory arrangement of claim 1, comprising at least one continuous clock line connecting said memory to said interface for providing said RDT clock signal to said interface; via said clock line a clock signal provided by said memory being transmitted together with said read data to said interface.

5. The memory arrangement of claim 1, wherein said DLL circuit comprises at least one delay device for shifting said internal clock signal by a predetermined time period.

6. The memory arrangement of claim 1, comprising an interface circuit being comprised of a control device, said interface and a bus being able to operate bidirectionally; said control device being configured to control writing data to and reading said read data from said memory via said control device and said bus.

7. The memory arrangement of claim 1, wherein DQS clock signals can be coupled into said register device via said interface; said DQS clock signal indicating that a valid of said read data are applied to said interface.

8. The memory arrangement of claim 1, wherein said memory a DDR memory or a DDR SRAM memory.

9. The memory arrangement of claim 1, wherein said register device comprises at least two data sampling registers whose inputs and outputs are arranged in parallel with one another; said data sampling registers being able to operate at least at twice a sampling frequency and to which said read data to be read is written alternately in order to sample it.

10. The memory arrangement of claim 1, comprising a computation and evaluation device for evaluating said read data, said computation and evaluation device comprising a programmable device.

11. The memory arrangement of claim 10, wherein said computation and evaluation device comprises a clock generating device for generating said internal clock signal for said DLL circuit.

12. The memory arrangement of claim 1, comprising a clock generating device for generating said internal clock signal for said DLL circuit.

13. The memory arrangement of claim 1, comprising an SOC system operatively coupled to said memory via a bus; said SOC system comprising at least said interface, said DLL circuit, and said register device.

14. A method for reading data from a memory, comprising the steps of:
  applying read data at an interface in response to a read access to a memory;
  permanently applying an RDT clock signal, which is derived from an internal clock signal and is in synchronism with said read data, to said interface; and
  providing a DLL circuit in order to determine an optimum sampling time for said read data; said DLL circuit determining said optimum sampling time for said read data by comparing said internal clock signal with said RDT clock signal and producing a delayed clock signal for sampling said read data as a function of said determined optimum sampling time.

15. The method of claim 14, comprising shifting further said delayed clock signal so that said optimal sampling time is outside of a forbidden time window which results from at least one of a set-up time or a hold time for said read data, if at least one of said set-up time or said hold-time is violated.

16. The method of claim 15, comprising shifting said delayed clock signal in each case to the opposite side of a valid time window in which said read data is valid, if the clock for said delayed and shifted clock signal is outside said valid time window.

17. The method of claim 15, comprising shifting said delayed clock signal between two read accesses.

18. The method of claim 16, comprising shifting said delayed clock signal between two read accesses.

* * * * *